United States Patent

Yamada et al.

[11] Patent Number: 6,023,217
[45] Date of Patent: Feb. 8, 2000

[54] RESISTOR AND ITS MANUFACTURING METHOD

[75] Inventors: Hiroyuki Yamada; Masato Hashimoto; Seiji Tsuda, all of Fukui, Japan

[73] Assignee: Matsushita Electric Industrial Co., Ltd., Osaka, Japan

[21] Appl. No.: 09/226,549

[22] Filed: Jan. 7, 1999

[30] Foreign Application Priority Data

Jan. 8, 1998 [JP] Japan .................................. 10-002001
Jan. 8, 1998 [JP] Japan .................................. 10-002002

[51] Int. Cl.[7] .................................................. H01C 1/012
[52] U.S. Cl. ......................... 338/309; 338/307; 338/308; 338/328; 338/313
[58] Field of Search .................................... 338/307, 309, 338/313, 324, 328, 332

[56] References Cited

U.S. PATENT DOCUMENTS 3,611,275  10/1971  Leddy ................................. 339/258 P
4,529,960   7/1985  Uchida et al. .
4,792,781  12/1988  Takahashi et al. ...................... 338/307
4,884,053  11/1989  Bougger ................................ 338/275
5,379,017   1/1995  Katsuno ................................ 338/332

FOREIGN PATENT DOCUMENTS

0810614A1   5/1997  European Pat. Off. .
0 810 614   12/1997  European Pat. Off. .
31 22 612   12/1982  Germany .
04102302    4/1992  Japan .
4-102302    4/1992  Japan .
09069406    3/1997  Japan .

OTHER PUBLICATIONS

Search report corresponding to application No. EP 99 10 0262 dated Mar. 31 1999.

Primary Examiner—Lincoln Donovan
Assistant Examiner—Richard K. Lee
Attorney, Agent, or Firm—Ratner & Prestia

[57] ABSTRACT

A resistor comprising a substrate, a pair of first top electrode layers disposed at least on the top face of the substrate, a resistance layer disposed so as to electrically connect with the first top electrode layers, a protective layer disposed so as to cover at least the resistance layer, and a pair of second top electrode layers disposed at least on the top faces of the pair of first top electrode layers. At least one of the pairs of first top electrode layers or second top electrode layers partially extends to the substrate side faces.

25 Claims, 15 Drawing Sheets

RESISTOR AND ITS MANUFACTURING METHOD

FIELD OF THE INVENTION

The present invention relates to the field of resistors and their manufacturing methods which allow the high density mounting of resistors on printed wiring boards used for electronic equipment.

BACKGROUND OF THE INVENTION

One known resistor and its manufacturing method are disclosed in Japanese Laid-open Patent No. H4-102302. The resistor and its manufacturing method of the prior art are explained next with reference to FIGS. 10 to 12B.

FIG. 10 is a sectional view of a resistor of the prior art. As shown in FIG. 10, a first top electrode layer 2 is disposed on both left and right ends of the top face of an insulated substrate 1. A resistance layer 3 is disposed on the insulated substrate 1 so as to partially overlap the first top electrode layer 2. A first protective layer 4 is disposed to cover only the entire face of the resistance layer 3. A trimming groove 5 is provided on the resistance layer 3 and the first protective layer 4 so as to adjust the resistance value. A second protective layer 6 is disposed on the top face of the first protective layer 4. A second top electrode layer 7 is disposed on the top face of the first top electrode layer 2 stretching to the full width of the insulated substrate 1. A side electrode layer 8 is disposed on a side face of the insulated substrate 1. A nickel layer 9 and solder layer 10 are disposed on the surface of the second top electrode layer 7 and the side electrode layer 8. Here, the height of the solder layer 10 is lower than that of the second protective layer 6. In other words, the second protective layer 6 of the resistor of the prior art generally protrudes from the entire resistor.

A manufacturing method of the resistor of the prior art as configured above is explained next with reference to drawings.

FIGS. 11A to 11F are perspective views of the resistor illustrating how the resistor of the prior art is manufactured. First, as shown in FIG. 11A, the first top electrode layer 2 is applied and formed on both left and right ends of the top face of the insulated substrate 1. The resistance layer 3 is then applied and formed on the top face of the insulated substrate 1 so as to partially overlap the first top electrode layer 2. (FIG. 11B)

Then, as shown in FIG. 11C, after applying and forming the first protective layer 4 so as to cover only the entire resistance layer 3, the trimming groove 5 is provided on the resistance layer 3 and the first protective layer 4 by means such as a laser beam to adjust the resistance value of the resistance layer 3 to within a specified allowable resistance.

As shown in FIG. 11D, the second protective layer 6 is applied and formed only on the top face of the first protective layer 4. The second top electrode layer 7 is then applied and formed on the top face of the first top electrode layer 2, stretching to the full width of the insulated substrate 1 (FIG. 11E).

Then, as shown in FIG. 11F, the side electrode layer 8 is applied and formed on the first top electrode layer 2 and the left and right side faces of the insulated substrate 1 so as to electrically connect with the first top electrode layer 2 and the second top electrode layer 7.

Lastly, the surfaces of the second top electrode layer 7 and the side electrode layer 8 are plated with nickel, and then soldered to form the nickel layer and solder layer 10, as shown in FIG. 10, completing the manufacture of the resistor of the prior art.

However, as shown in FIG. 12A, when the above configuration of the resistor of the prior art is soldered to a printed wiring board using the above manufacturing method of the prior art, the resistor is soldered at both the side electrode layer and the bottom, forming a fillet 11. Accordingly, mounting of the conventional resistor by soldering requires a fillet, resulting in the occupation of an area 13 for soldering at the side faces in addition to the component area 12, as shown in FIG. 12B. This means the prior art requires a mounting area 14. Furthermore, as dimensions of components shrink to increase mounting density, the percentage of soldering area in proportion to mounting area grows. This further limits attempts to increase mounting density for making electronic equipment smaller.

SUMMARY OF THE INVENTION

A resistor of the present invention comprises a substrate, a pair of first top electrode layers disposed on the top face of the substrate, a resistance layer disposed so as to electrically connect with the first top electrode layers, a protective layer disposed so as to cover at least the resistance layer, and a pair of second top electrode layers disposed at least on the top faces of each first top electrode layer. At least one of the pairs of first top electrode layers and second top electrode layers extends to a portion of the side face of the substrate.

A method for manufacturing a resistor of the present invention comprises the steps of disposing the first top electrode layers at least on the top face of a sheet substrate having a division slit, disposing the resistance layer so as to electrically connect between the first top electrode layers, disposing the protective layer so as to cover at least the top face of the resistance layer, and disposing the second top electrode layers so as to electrically connect with at least the first top electrode layers; and the steps of dividing the sheet substrate along the division slit into a substrate strips, and dividing the substrate strips into substrate pieces. At least one of the pairs of first top electrode layers and the second top electrode layers is formed to cover the division slit by applying an electrode paste to fill inside the division slits.

With the above configuration and the manufacturing method of the present invention, a resistor is soldered to a printed wiring board by the top electrode and the side electrode disposed on a portion of the side face of the substrate when the resistor is mounted on the printed wiring board. This enables a reduction in the area required for forming a solder fillet, resulting in the reduction of the mounting area including the soldered area on a printed wiring board.

DESCRIPTION OF THE PREFERRED EMBODIMENT

First Exemplary Embodiment

A resistor and its manufacturing method of the present invention are explained with reference to FIGS. 1 to 3B.

Figure 1:
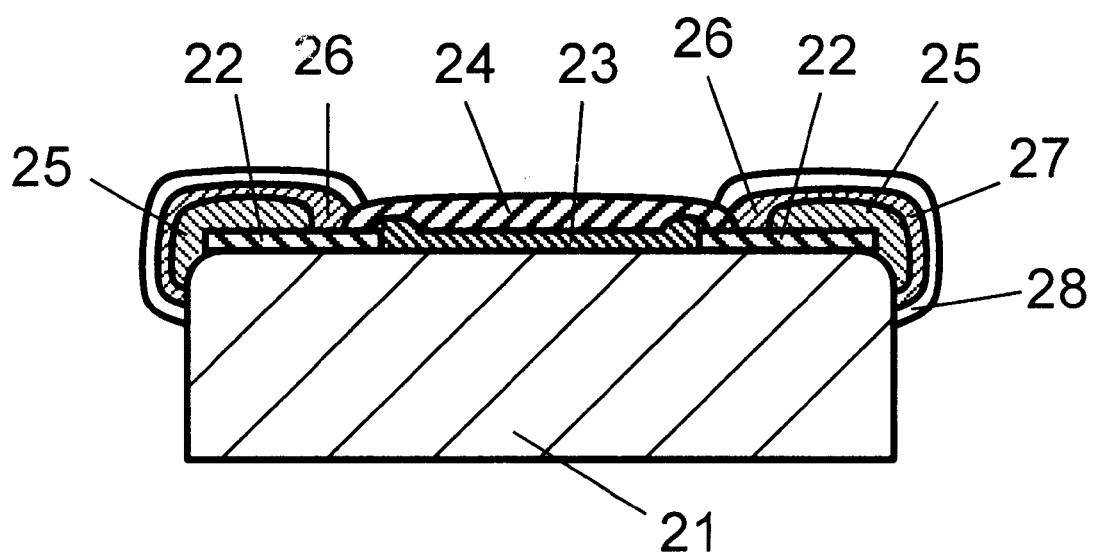
FIG. 1 is a section view of a resistor in accordance with a first exemplary embodiment of the present invention.

As shown in FIG. 1, a pair of first top electrode layers 22, typically a mixture of glass frit and a conductive powder such as Ag, are disposed on both ends of the top face of a substrate 21, typically made of 96% aluminum. A resistance layer 23, typically constituted of mainly ruthenium oxide is disposed so as to electrically connect with the first top electrode layers 22. A protective layer 24, typically epoxy resin, is disposed to cover the entire top face of the resistance layer 23. A second top electrode layer 25, typically a mixture of epoxy resin and a conductive powder such as Ag, is disposed on the top face of the first top electrode layers 22 and a part of the side face of the substrate 21. The area of the second top electrode layer 25 formed on a part of the side face of the substrate 21 is half or smaller than the entire side face of the substrate 21. A clearance 26 is created between the protective layer 24 and the second top electrode layer 25. In other words, the first top electrode layers 22 have an exposed area at the clearance 26 which is neither covered by the protective layer 24 nor the second top electrode layer 25. A nickel layer 27 and solder layer 28 may be disposed on the second top electrode layer 25, as required, to secure quality such as reliability when the resistor is soldered. The exposed area of the first top electrode layers 22 and the nickel layer 27 are in direct electrical contact through the clearance 26.

Next, a method for manufacturing the resistor in the first exemplary embodiment of the present invention is explained with reference to drawings.

FIGS. 2A to 2G illustrate an exemplary method for manufacturing a resistor in accordance with the first exemplary embodiment of the present invention.

Figure 2A:
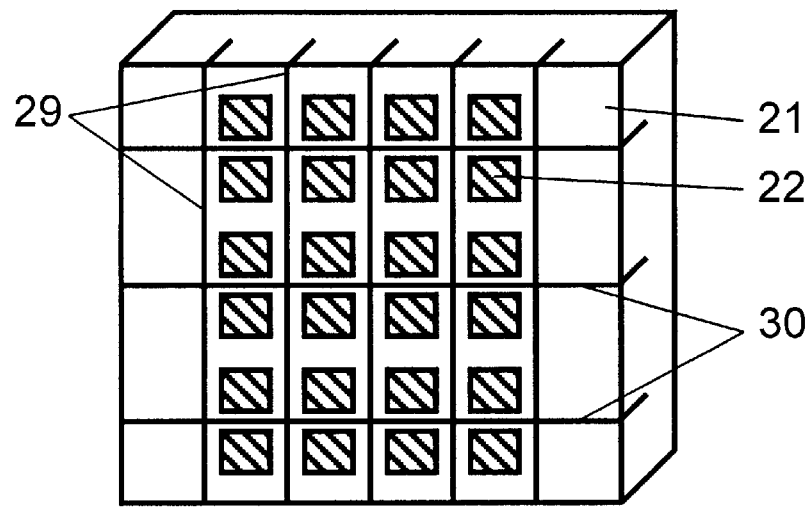
FIGS. 2A to 2G are perspective views of an exemplary resistor at various stages of manufacture on a sheet substrate, illustrating an exemplary method for manufacturing a resistor in accordance with the first exemplary embodiment.

As shown in FIG. 2A, a sheet substrate 21, typically 96% aluminum, with good heat resistance and insulation, has more than one vertical division slit 29 and more than one horizontal division slit 30. After printing an electrode paste, typically containing glass frit and a conductive powder such as Ag, on both sides of the horizontal division slit 30 without crossing the horizontal division slit 30, the sheet substrate 21 is fired at approximately 850° C. to form the first top electrode layer 22. The depth of the division slits 29 and 30 is half or less of the thickness of substrate 21 to prevent breakage due to handling during manufacturing.

Figure 2B:
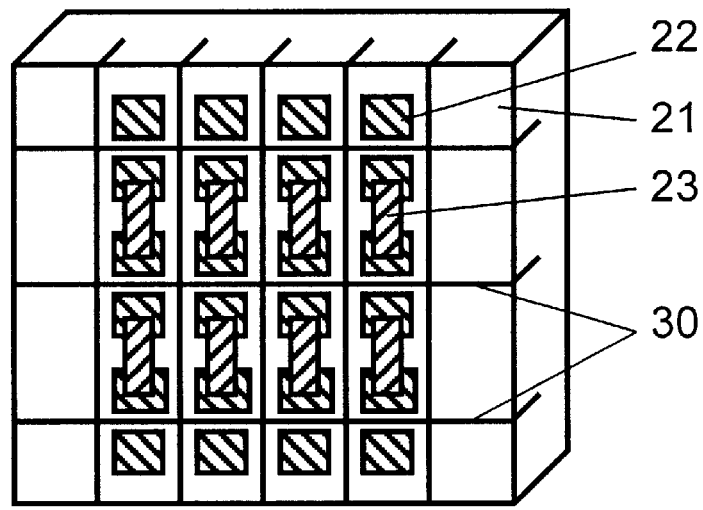

Then, as shown in FIG. 2B, a resistance paste, typically made mainly of ruthenium oxide, is printed so as to electrically connect with the first top electrode layers 22, and is fired at approximately 850° C. to form the resistance layer 23.

Figure 2C:
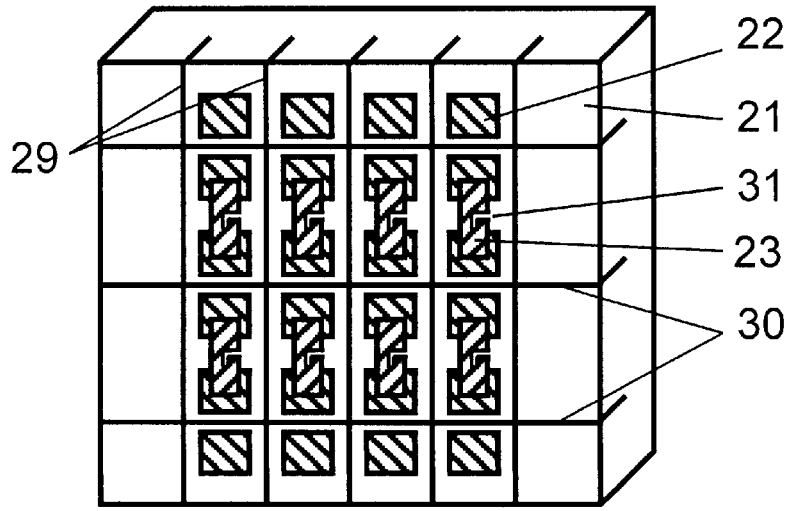

As shown in FIG. 2C, a trimming groove 31 is provided by means such as a YAG laser to adjust the resistance of the resistance layer 23 to a specified value. A trimming probe for measuring the resistance value may be placed on the first top electrode layer 22 before trimming.

Figure 2D:
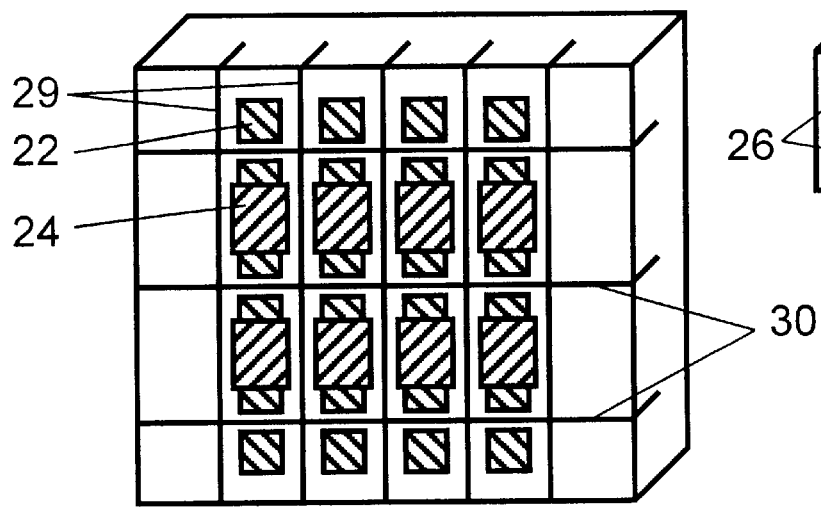

As shown in FIG. 2D, a resin paste, typically made of epoxy resin, is printed so as to protect the adjusted resistance layer 23, and baked in a conveyor-type continuous curing furnace at approximately 200° C. for approximately 30 minutes to thermally cure and form the protective layer 24. The protective layer 24 may be provided to cover more than one resistance layer 23 horizontally aligned, crossing the vertical division slit 29.

Figure 2G:
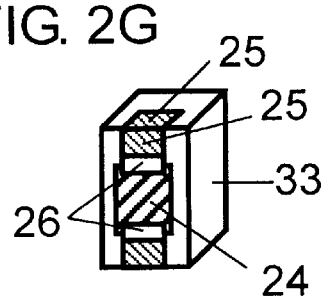
Figure 2E:
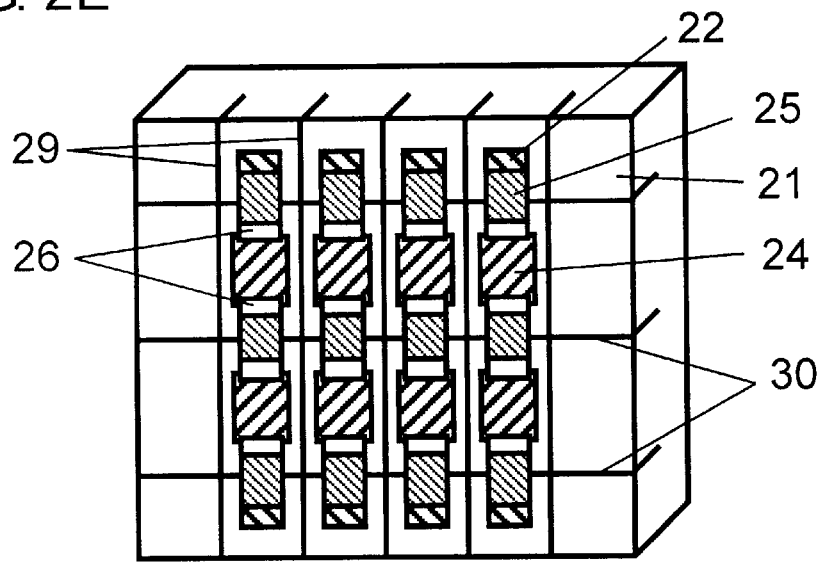

As shown in FIG. 2E, an electrode paste made typically of conductive powder, such as Ag or Ni, and epoxy resin is screen printed on each of the first top electrode layers 22 of adjacent resistors in the vertical direction, crossing the horizontal division slit 30 of the sheet substrate 21 without overlapping the protective layer 24. The first top electrode layers 22 consequently have an exposed area 26 that is neither covered by the protective layer 24 nor the second top electrode layer 25. After printing the electrode paste, the substrate 21 is baked in a conveyor-type continuous curing furnace at approximately 200° C. for approximately 30 minutes to thermally cure and form a second top electrode layer 25. The electrode paste fills the horizontal division slit 30 to form the second top electrode layer 25 to the bottom of the division slit. The second top electrode layer 25 may also be formed continuously on each of the first top electrode layers 22 of adjacent resistors in the horizontal direction, crossing the vertical division slit 29.

Figure 2F:
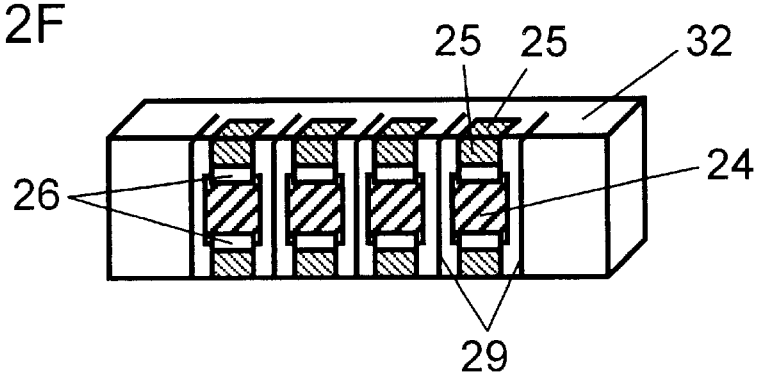

Next, as shown in FIG. 2F, the sheet substrate 21 is divided along the horizontal division slit 30 to create a substrate strip 32. As shown, the second top electrode layer 25 that filled into horizontal division slit 30, extends onto the divided face of the substrate strip 32.

Lastly, as shown in FIG. 2G, the substrate strip 32 is divided along the vertical division slit 29 to create a substrate piece 33. As shown in FIG. 1, nickel layer 27 as a middle layer and a solder layer 28 as an outermost layer are electroplated in turn on an exposed surface of the second top electrode layer 25, completing the manufacture of the resistor of the present exemplary embodiment.

Figure 3A:
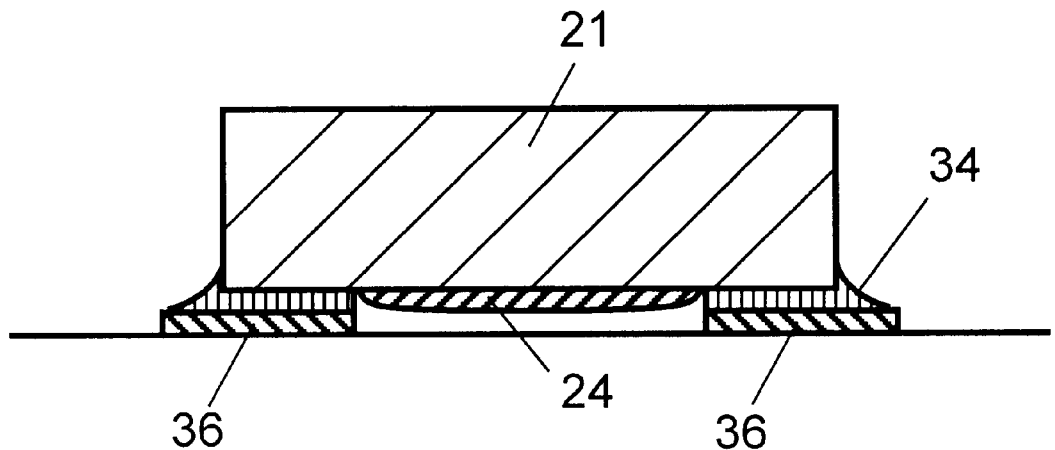
FIG. 3A is a section view of a mounted resistor in accordance with the first exemplary embodiment of the present invention.
Figure 3B:
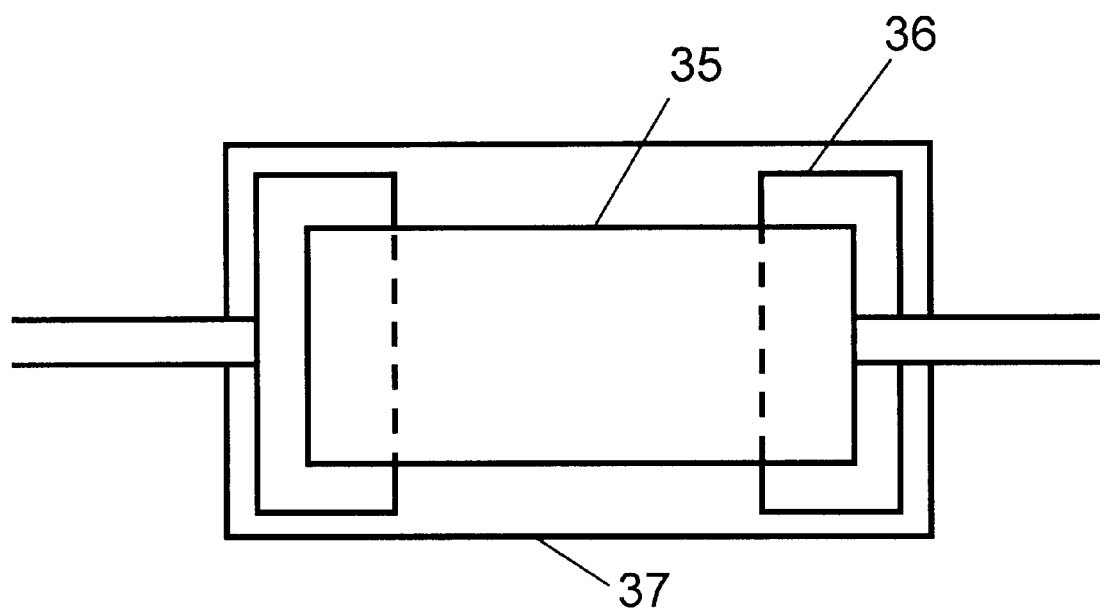
FIG. 3B is a top view of the mounted resistor in accordance with the first exemplary embodiment of the present invention.

FIGS. 3A and 3B show a resistor, manufactured using the above steps, mounted on a printed wiring board. As shown in the figures, the surface of the resistor where the protective layer 24 is formed faces down for mounting. The first top electrode layer 22 and the second top electrode layer 25, including the side electrode portion of the second top electrode layer 25 that extends to the side face of the substrate as shown in FIG. 2, are all soldered. It should be noted that since the area of the side electrode portion of electrode layer 25 is small, an extremely small fillet 34, compared with that needed for a resistor of the prior art, is formed. Accordingly, as shown in FIG. 3B, a total of a resistor area 35 and a resistor side face area 36 required for soldering the resistor is the mounting area 37. When a square chip resistor of 0.6 mm×0.3 mm is used, the resistor in the first exemplary embodiment enables reduction of the mounting area by 20% compared to the configuration of a conventional resistor.

As explained above, the present invention requires only a small area for forming a fillet when soldering the resistor onto a printed wiring board because the area of the side electrode of the resistor is small, enabling reduction of the mounting area.

The second top electrode layer is made of a conductive paste consisting of a conductive powder and epoxy resin. If Ag is used as a conductive powder, its conductive resistance is as high as approximately $10^{-4}$ $\Omega$ cm, and approximately $10^{-2}$ $\Omega$ cm when nickel is used as conductive powder (approximately $10^{-6}$ $\Omega$ cm when nickel plating or Ag grazed material are used). Accordingly, variations in the thickness when forming the second top electrode layer result in variations in resistance value of the resistor, because the conductive resistance value is added to the specified resistance. However, as shown in FIG. 1, the resistor is not affected by the second top electrode layer 25 which has high conductive resistance, because any exposed area of the first top electrode layer 22 and the nickel layer 27, which has low conductive resistance, are in direct electrical contact at the clearance 26. This results in the reliable manufacture of a highly accurate resistor.

The first exemplary embodiment describes first top electrode layer 22 and nickel layer 27 as being in direct electrical contact. However, this is not intended as a limitation to the nickel layer. The same effect is achievable by placing the solder layer and the first top electrode layer 22 in direct electrical contact, or by using a material with low conductive resistance that does not affect the resistance value of the resistor.

The first exemplary embodiment preferably uses ruthenium oxide grazed material as the resistance layer 23. However, the material used for the resistance layer is not limited to ruthenium oxide grazed material. For example, the same effect is achievable by the use of nichrome thin film material for the resistance layer.

By making the surface of solder layer 28 level with or higher than the surface of protective layer 24, the first exemplary embodiment also improves mounting quality by preventing generation of a space between the solder layer 28 and the land (not illustrated) of the printed wiring board.

The first exemplary embodiment also enables the further reduction of the mounting area by eliminating the creation of the side electrode and not forming a fillet when soldering the resistor to the printed wiring board. However, if no fillet is formed, automated inspection using image recognition may become less effective. Accordingly, it is preferable to form a fillet even it is small.

Table 1 shows the effects (improved characteristics) achieved by the combination of materials used for the first top electrode layer 22, protective layer 24, and second top electrode layer 25.

TABLE 1

| Combi-Nation | First top electrode layer 22 | Second top electrode layer 25 | Protective layer 24 | Improved characteristics |
|---|---|---|---|---|
| 1 | Ag conductive powder + Glass (Baked at 850° C.) | Ag conductive powder + Resin (Cured at 200° C.) | Resin system (Cured at 200° C.) | Low treatment temperature for the protective layer 24 prevents changes in a resistance value in the process, reducing deviations in the resistance of products. |
| 2 | Ag conductive powder + Glass (Baked at 850° C.) | Ni conductive powder + resin (Cured at 200° C.) | Resin system (Cured at 200° C.) | In addition to the characteristics of the above combination 1, the use of a base metal for the second top electrode enables manufacture of the resistor less expensively. |
| 3 | Au conductive powder + Glass (Baked at 850° C.) | Ag conductive powder + Resin (Cured at 200° C.) | Resin system (Cured at 200° C.) | Less ion migration improves the moisture resistance life characteristic. |
| 4 | Au conductive Powder + Glass (Baked at 850° C.) | Ni conductive powder + Resin (Cured) at 200° C.) | Resin system (Cured at 200° C.) | Combined characteristics of the above Combinations 2 and 3. |
| 5 | Au organic metal Compound (Baked at 850° C.) | Ag conductive powder + Resin (Cured at 200° C.) | Resin system (Cured at 200° C.) | In addition to the characteristics of the above combination 3, the reduced use of Au enables manufacture of the resistor less expensively. |
| 6 | Au organic metal Compound (Baked at 850° C.) | Ni conductive powder + Resin (Cured at 200° C.) | Resin system (Cured at 200° C.) | Combined characteristics of the above Combinations 3 and 5. |

Second Exemplary Embodiment

A resistor in accordance with a second exemplary embodiment of the present invention is explained with reference to FIG. 4.

Figure 4:
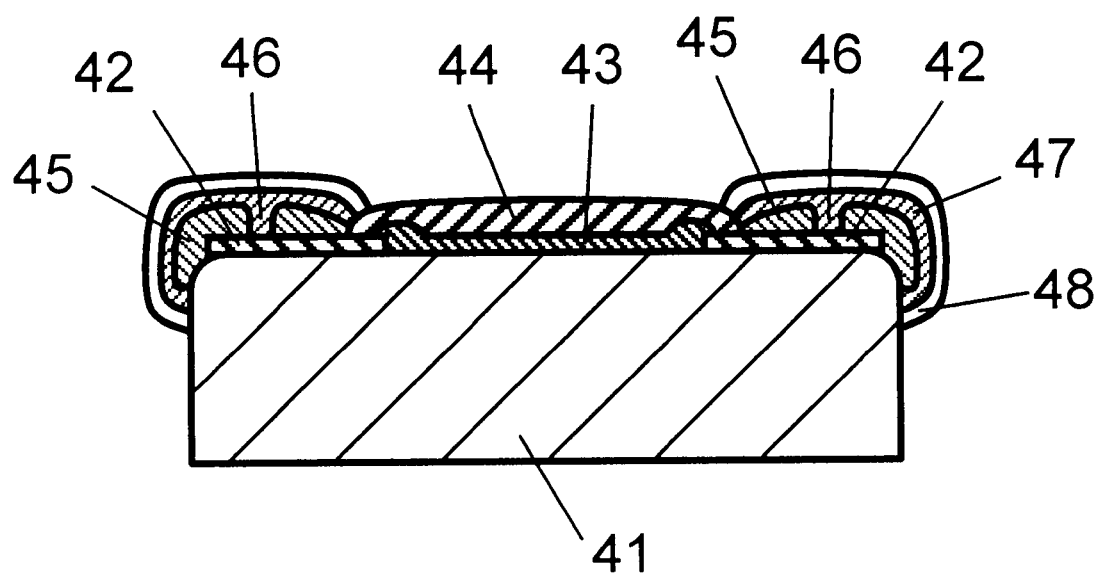
FIG. 4 is a section view of a resistor in accordance with a second exemplary embodiment of the present invention.

As shown in FIG. 4, a pair of first top electrode layers 42, typically a mixture of glass frit and a conductive powder such as Ag, are disposed on both ends of the main surface of a substrate 41, typically made of 96% aluminum. A resistance layer 43, typically constituted mainly of ruthenium oxide, is formed so as to electrically connect with the first top electrode layers 42. A protective layer 44, typically made of epoxy resin, is disposed on the top face of the resistance layer 43. A second top electrode layer 45, typically a mixture of epoxy resin and a conductive powder such as Ag, is disposed on the top face of the first top electrode layers 42 and a part of the side face of the substrate 41. Here, the area of the second top electrode layer 45 on the side face of the substrate 41 is half or smaller than the entire side face of the substrate 41. A window 46 is created on the second top electrode layer 45. Accordingly, the first top electrode layers 42 have an exposed area, at the window 46, which is neither covered by the protective layer 44 nor the second top electrode layer 45. A nickel layer 47 and solder layer 48 may be disposed on the second top electrode layer 45, as required, to secure quality such as reliability when the resistor is soldered. The first top electrode layers 42 and nickel layer 47 are in direct electrical contact through the window 46.

Points in a method for manufacturing the resistor in this exemplary embodiment different from the first exemplary embodiment is that a screen printing mask is used for forming the second top electrode layer 45 in order to create the window 46. Other steps are the same as the first exemplary embodiment.

The effect of the resistor in the second exemplary embodiment when it is soldered to a printed wiring board is also the same as the first exemplary embodiment, and thus its explanation is omitted here.

Third Exemplary Embodiment

A resistor and its manufacturing method in accordance with a third exemplary embodiment of the present invention are explained with reference to FIGS. 5 to 7B.

Figure 5:
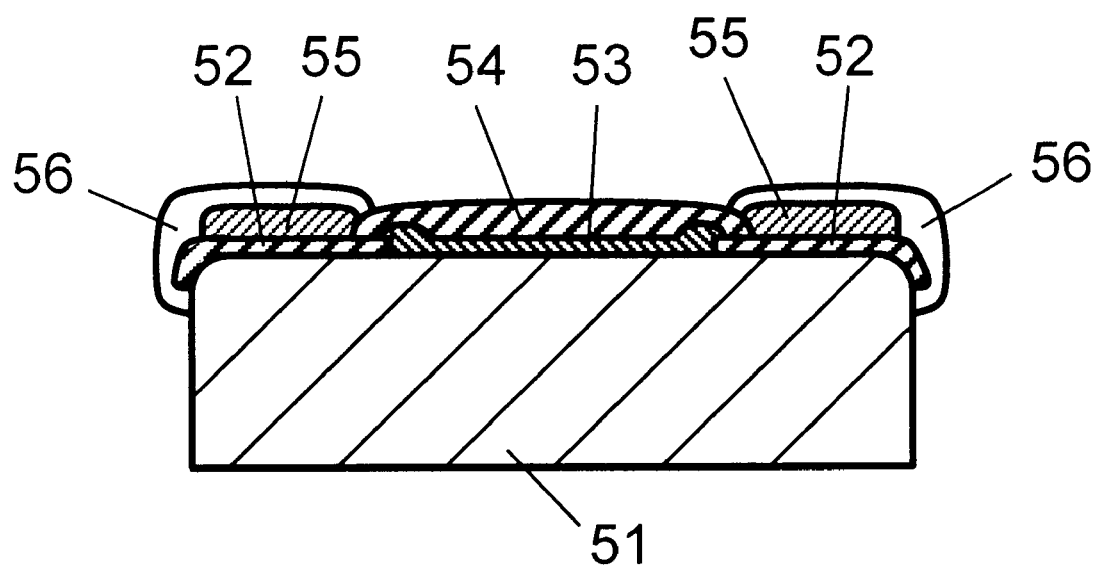
FIG. 5 is a section view of a resistor in accordance with a third exemplary embodiment of the present invention.

As shown in FIG. 5, a pair of first top electrode layers 52, typically a mixture of glass frit and a conductive powder such as Ag, are disposed on both ends of the top face and a part of the side face of a substrate 51, typically made of 96% aluminum. An area of the first top electrode layers 52 on the side face of the substrate 51 is half or less of the entire side face of the substrate 51. A resistance layer 53, typically made mainly of ruthenium oxide, is disposed so as to electrically connect with the pair of first top electrode layers 52. A protective layer 54, typically made mainly of glass is disposed so as to cover at least the top face of the resistance layer 53. A second top electrode layer 55, typically a mixture of glass frit and a conductive powder such as Cu, is disposed on the top face of the first top electrode layers 52. An edge of the second top electrode layer 55 is curved. A solder layer 56 is electroplated so as to cover at least an exposed top face of the second top electrode layer 55.

Next, a method for manufacturing the resistor in the third exemplary embodiment is explained with reference to FIGS. 6A to 6G.

Figure 6A:
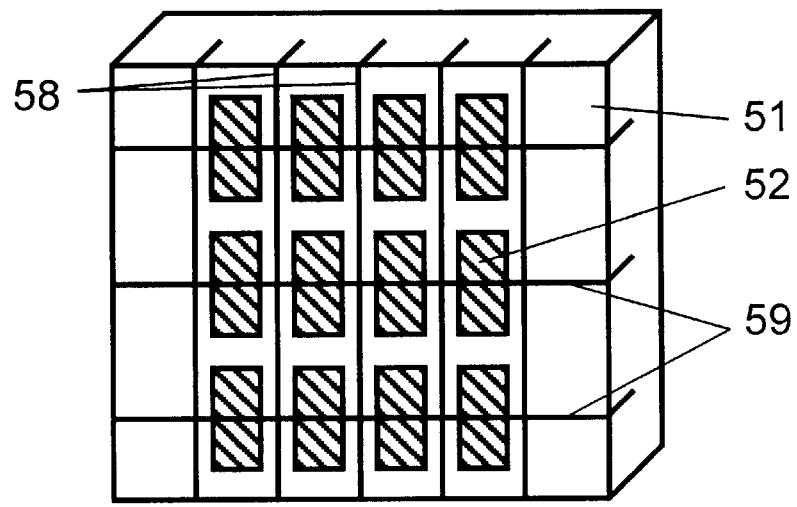
FIGS. 6A to 6G are perspective views of an exemplary resistor at various stages of manufacture on a sheet substrate, illustrating an exemplary method for manufacturing a resistor in accordance with the third exemplary embodiment.

As shown in FIG. 6A, a sheet substrate 51, typically 96% aluminum, with good heat resistance and insulation, has more than one vertical division slit 58 and horizontal division slit 59 on its surface. An electrode paste, typically containing glass frit and a conductive powder such as Ag, is printed, crossing and filling inside the horizontal division slit 59, and is fired at approximately 850° C. to form the first top electrode layer 52. Since the electrode paste fills the horizontal division slit 59, the first top electrode layer 52 is formed to the bottom of the division slit. The depth of the division slits 58 and 59 is half or less of the thickness of the substrate 51 to prevent breakage due to handling during manufacturing.

Figure 6B:
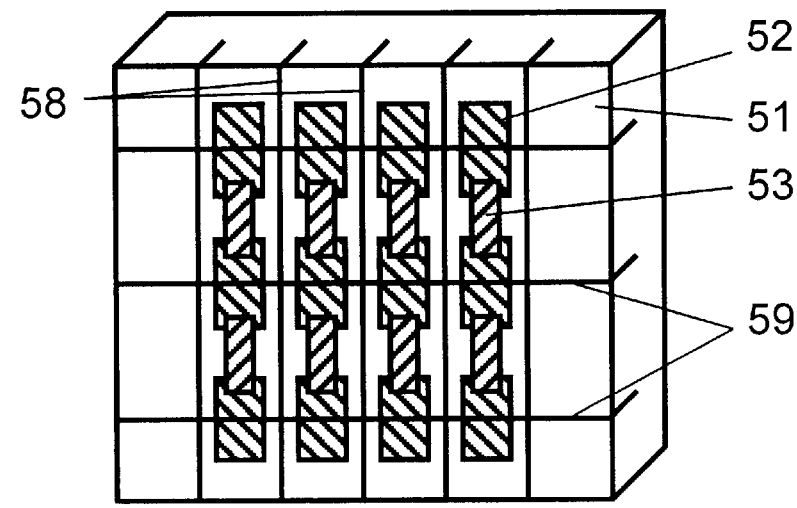
Figure 6C:
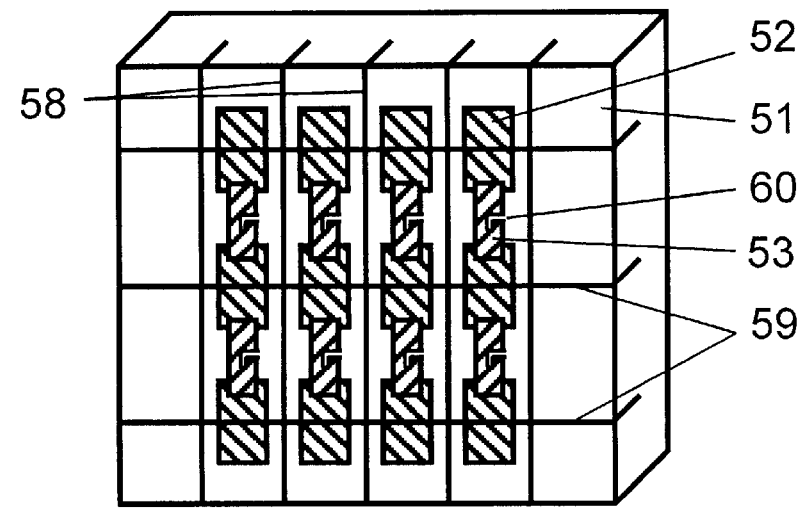

Next, as shown in FIG. 6B, a resistance paste, typically made mainly of ruthenium oxide, is printed so as to electrically connect with the first top electrode layers 52, and fired at approximately 850° C. to form the resistance layer 53. As shown in FIG. 6C, a trimming groove 60 is provided by means such as a YAG laser to adjust the resistance of the resistance layer 53 to a specified value. A trimming probe for measuring the resistance value may be placed on the first top electrode layers 52 before trimming.

Figure 6D:
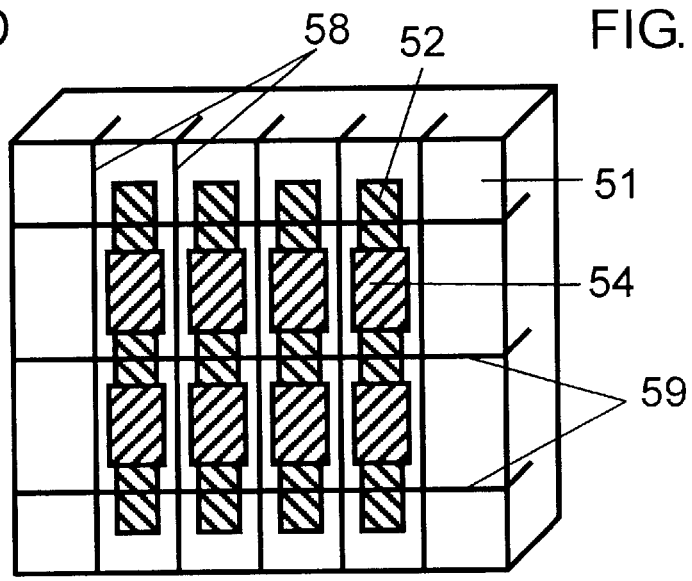

Next, as shown in FIG. 6D, a paste typically made mainly of glass is printed to protect the adjusted resistance layer 53, and fired at approximately 600° C. to form a protective layer 54. The protective layer 54 may be provided to cover all of more than one resistance layer 53 horizontally aligned, crossing the vertical division slit 58.

Figure 6G:
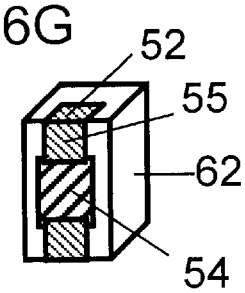
Figure 6E:
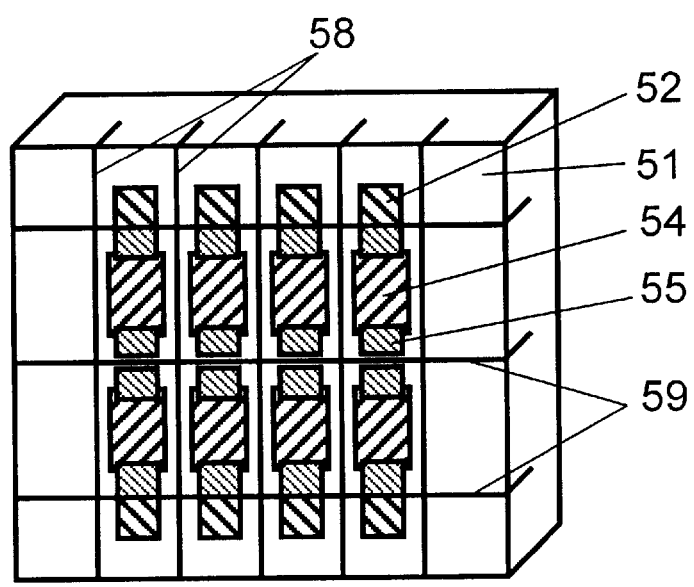

Next, as shown in FIG. 6E, an electrode paste, typically containing a mixture of glass frit and a conductive powder such as Cu, is printed on the top face of the first top electrode layer 52 without crossing the horizontal division slit 59, and fired at approximately 600° C. in the nitrogen ambient to form a second top electrode layer 55. The second top electrode layer 55 may be formed continuously over each of the first top electrode layers 52 of adjacent resistors in the horizontal direction, crossing the vertical division slit 58.

Figure 6F:
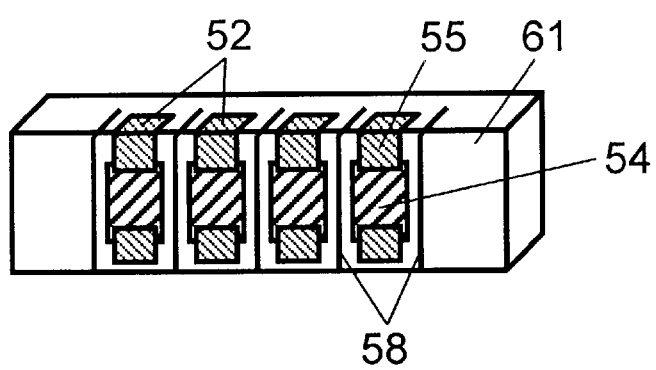

Next, as shown in FIG. 6F, the sheet substrate 51 is divided along the horizontal division slit 59 to create a substrate strip 61. As shown, the first top electrode layer 52 that filled into horizontal division slit 59, extends onto the divided face of the substrate strip 61.

Lastly, as shown in FIG. 6G, the substrate strip 61 is divided along the vertical division slit 58 to create a substrate piece 62. Solder is electroplated on an exposed surface area of the first top electrode layers 52 and the second top electrode layer 55 to create a solder layer 56, as shown in FIG. 5, completing the manufacture of the resistor in this exemplary embodiment.

Figure 7A:
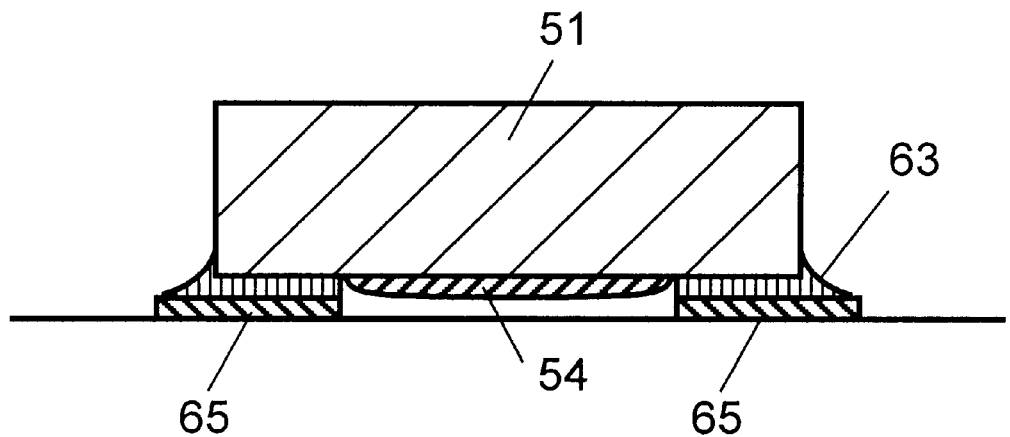
FIG. 7A is a section view of a mounted resistor in accordance with the third exemplary embodiment of the present invention.
Figure 7B:
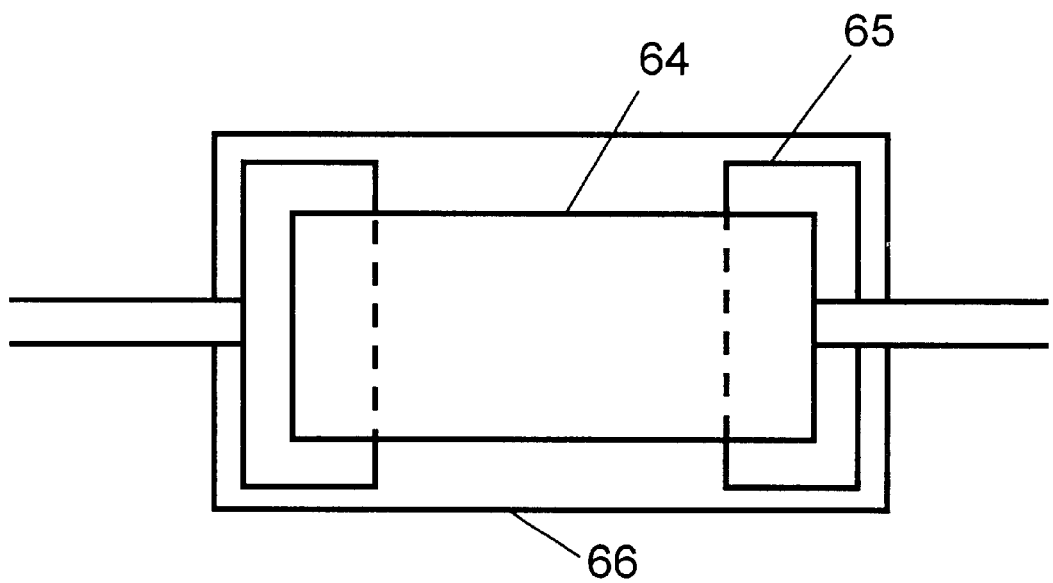
FIG. 7B is a top view of the mounted resistor in accordance with the third exemplary embodiment of the present invention.

FIGS. 7A and 7B show the resistor in the third exemplary embodiment mounted on a printed wiring board. It is apparent that the surface of the resistor where the protective layer 54 is formed is facing down for mounting. The second top electrode layer 55 and the side electrode which is a part of the first top electrode layer 52 extending to the side face of the substrate 51, as shown in FIG. 5, are all soldered. It should be noted that since the area of the side electrode (FIG. 5) is small, an extremely small fillet 63, compared with that needed for a resistor of the prior art is formed. Accordingly, as shown in FIG. 7B, the total mounting area 66 required for soldering the resistor includes a resistor area 64 and a resistor side face area corresponding to land 65. When a square chip resistor of 0.6 mm×0.3 mm is used, the resistor in the third exemplary embodiment enables reduction of the mounting area by approximately 20%, compared to the configuration of the conventional resistor.

As explained above, the present invention requires only a small area for forming a fillet when soldering the resistor onto a printed wiring board because the area of the side electrode of the resistor is small, enabling reduction of the mounting area.

By making the surface of the solder layer 56 level with or higher than and the surface of protective layer 54, the third exemplary embodiment also improves mounting quality by preventing generation of space between the solder layer 56 and the land 65 of the printed wiring board. The third exemplary embodiment also enables the further reduction of the mounting area by eliminating the creation of the side electrode and not forming a fillet when soldering the resistor onto a printed wiring board. However, if no fillet is formed, automated inspection using image recognition may become less effective. Accordingly, it is preferable to form a fillet even it is small.

Table 2 and 3 show the effects (improved characteristics) achieved by changing the combination of materials used for the first top electrode layers 52, protective layer 54, and second top electrode layer 55.

TABLE 2

| Combination | First top electrode layer 52 | Second top electrode layer 55 | Protective layer 54 | Improved characteristics |
|---|---|---|---|---|
| 1 | Ag conductive powder + Glass (Baked at 850° C.) | Ag Pd conductive powder + Glass (Baked at 600° C.) | Glass system (Cured at 600° C.) | Baking of the second top electrode layer in air enables manufacture of the resistor less expensively. |
| 2 | Ag conductive powder + Glass (Baked at 850° C.) | Ni conductive powder + resin (Baked at 600° C.) | Glass system (Cured at 600° C.) | In addition to the characteristics of the combination 1, the use of Ni for the electrode enables manufacture of the resistor less expensively. |
| 3 | Ag conductive powder + Glass (Baked at 850° C.) | Cu conductive powder + Resin (Cured at 200° C.) | Resin system (Cured at 200° C.) | Low treatment temperature for the protective layer 54 prevents changes in a resistance value in the process, reducing deviations in the resistance of products. |
| 4 | Ag conductive powder + Glass (Baked at 850° C.) | Ni conductive Powder + Resin (Cured at 200° C.) | Resin system (Cured at 200° C.) | In addition to the characteristics of the combination 3, the use of Ni for the second top electrode enables manufacture of the resistor less expensively. |
| 5 | Ag conductive powder + Glass (Baked at 850° C.) | Cu + Ni mixed Conductive powder + Resin (Cured at 200° C.) | Resin system (Cured at 200° C.) | In addition to the characteristics of the above combination 3, the use of Cu + Ni for the second top electrode stabilizes solder wetting. |
| 6 | Ag conductive powder + Glass (Baked at 850° C.) | Cu + Ni alloy Conductive powder + Resin (Cured at 200° C.) | Resin system (Cured at 200° C.) | In addition to the characteristics of the above combination 3, the use of Cu + Ni for the second top electrode stabilizes solder wetting. |
| 7 | Au conductive powder + Glass (Baked at 850° C.) | Cu conductive powder + glass (Baked at 600° C.) | Glass system (Cured at 600° C.) | Less ion migration improves the moisture resistance life characteristic |
| 8 | Au conductive powder + Glass (Baked at 850° C.) | Ag Pd conductive powder + Glass (Baked at 600° C.) | Glass system (Cured at 600° C.) | Combined characteristics of the above combinations 1 and 7. |

TABLE 3

| Combination | First top Electrode layer 52 | Second top electrode layer 55 | Protective layer 54 | Improved characteristics |
|---|---|---|---|---|
| 9 | Au conductive Powder + Glass (Baked at 850° C.) | Ni conductive powder + Glass (Baked at 600° C.) | Glass system (Cured at 600° C.) | Combined characteristics of the above combinations 2 and 7. |
| 10 | Au conductive Powder + Glass (Baked at 850° C.) | Cu conductive powder + Resin (Cured at 200° C.) | Resin system (Cured at 200° C.) | Combined characteristics of the above combinations 3 and 7 |
| 11 | Au conductive Powder + Glass (Baked at 850° C.) | Ni conductive powder + Resin (Cured at 200° C.) | Resin system (Cured at 200° C.) | Combined characteristics of the above combinations 4 and 7. |
| 12 | Au conductive Powder + Glass (Baked at 850° C.) | Cu + Ni mixed conductive powder + Resin (Cured at 200° C.) | Resin system (Cured at 200° C.) | Combined characteristics of the above combinations 5 and 7. |
| 13 | Ag conductive Powder + Glass (Baked at 850° C.) | Cu + Ni alloy conductive powder + Resin (Cured at 200° C.) | Resin system (Cured at 200° C.) | Combined characteristics of the above combinations 6 and 7. |

Fourth Exemplary Embodiment

A resistor and its manufacturing method in accordance with a fourth exemplary embodiment of the present invention are explained with reference to FIGS. 8 to 9G.

Figure 8:
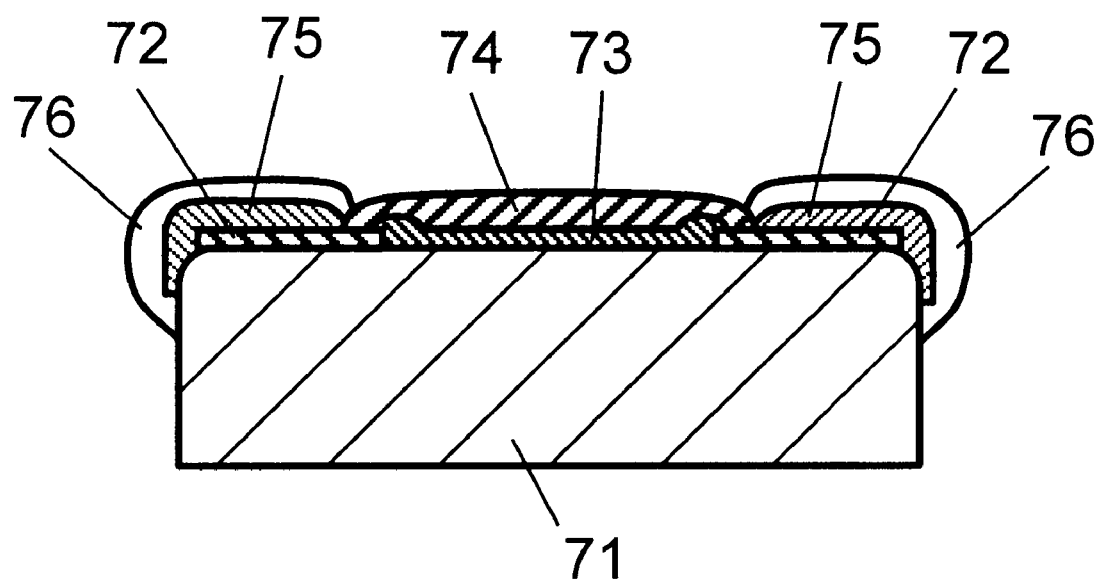
FIG. 8 is a section view of a resistor in accordance with a fourth exemplary embodiment of the present invention.

As shown in FIG. 8, a pair of first top electrode layers 72, typically a mixture of glass frit and a conductive powder such as Ag, are disposed on both ends of the top face of a substrate 71, typically 96% aluminum. A resistance layer 73, typically made mainly of ruthenium oxide, is disposed so as to electrically connect with the first top electrode layers 72. A protective layer 74, typically made mainly of glass, is disposed so as to cover the top face of the resistance layer 73. A second top electrode layer 75, typically containing glass frit and a conductive powder such as Cu, is disposed on the top face of the first top electrode layer 72 and a part of the side face of the substrate 71. Here, a part of the second top electrode layer 75 on the side face of the substrate 71 is half or less of the entire side face of the substrate 71. An edge of the second top electrode layer 75 is curved, and its exposed top face is covered with a solder layer 76.

Next, a method for manufacturing the resistor in the fourth exemplary embodiment is explained with reference to FIGS. 9A to 9G.

Figure 9A:
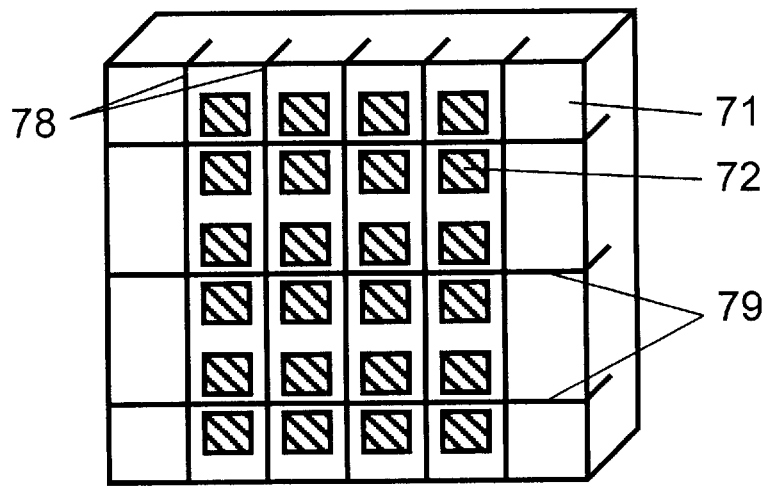
FIGS. 9A to 9G are perspective views of an exemplary resistor at various stages of manufacture on a sheet substrate, illustrating an exemplary method for manufacturing a resistor in accordance with the fourth exemplary embodiment.

As shown in FIG. 9A, more than one vertical division slit 78 and horizontal division slit 79 are provided on the surface of the sheet substrate 71, typically made of 96% aluminum with good heat resistance and insulation. An electrode paste, typically containing glass frit and a conductive powder such as Ag, is printed on both sides of the horizontal division slit 79 without crossing the horizontal division slit 79, and fired at approximately 850° C. to form a first top electrode layers 72. The depths of division slits 78 and 79 are generally set to half or less of the thickness of substrate 71 so as to prevent breakage of the substrate by handling during manufacturing.

Figure 9B:
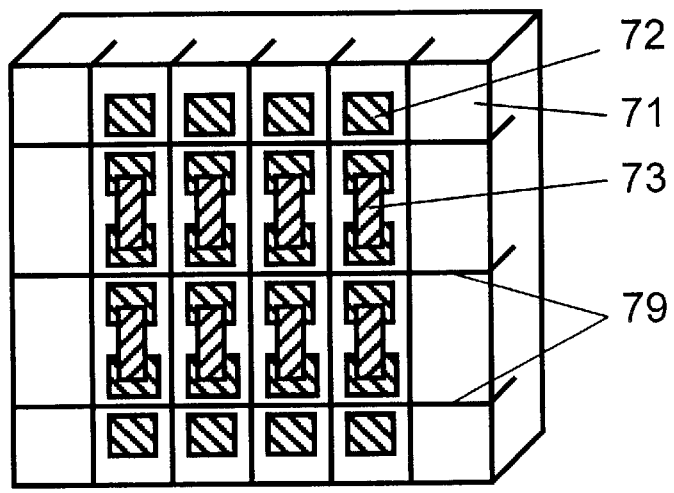
Figure 9C:
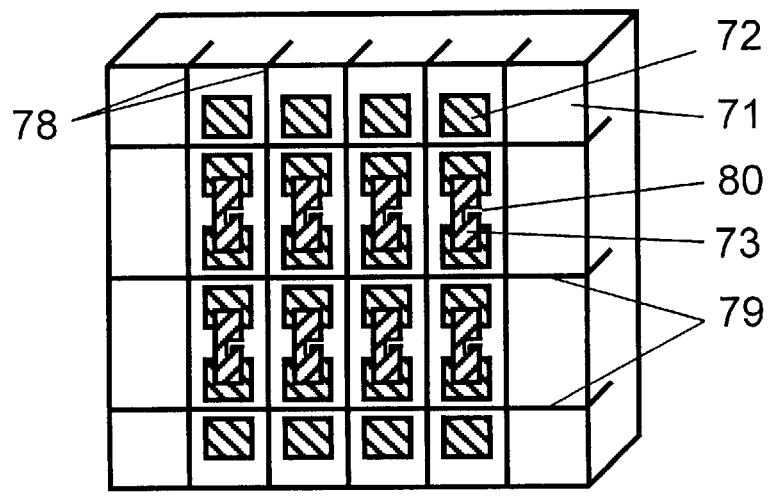

Next, as shown in FIG. 9B, a resistance paste, typically made mainly of ruthenium oxide, is printed so as to electrically connect with the first top electrode layer 72, and fired at approximately 850° C. to form the resistance layer 73. As shown in FIG. 9C, a trimming groove 80 is provided by means such as a YAG laser to adjust the resistance of the resistance layer 73 to a specified value. A trimming probe for measuring resistance may be placed on the first top electrode layers 72 before trimming.

Figure 9D:
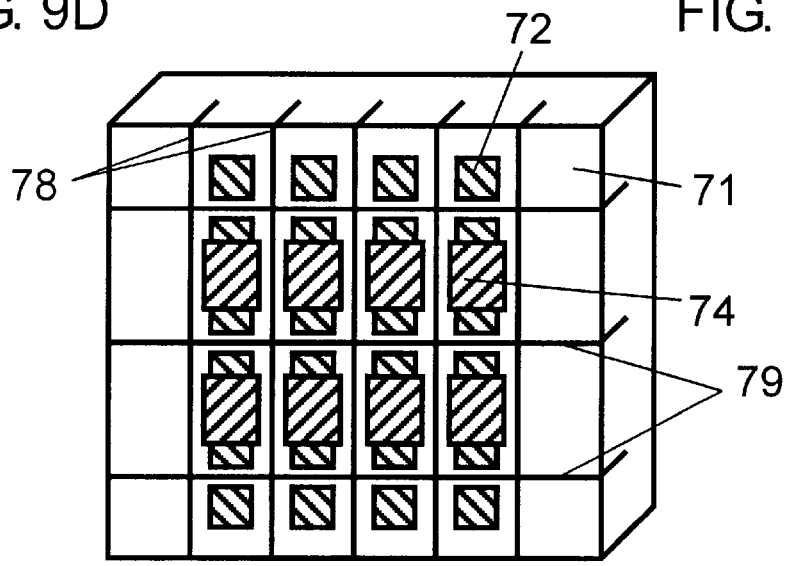

Next, as shown in FIG. 9D, a paste, typically made mainly of glass, is printed to protect the adjusted resistance layer 73, and fired at approximately 600° C. to form the protective layer 74. The protective layer 74 may be formed over all of more than one resistance layer 73 horizontally aligned, crossing the vertical division slit 78.

Figure 9G:
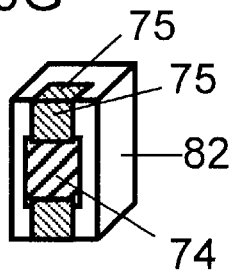
Figure 9E:
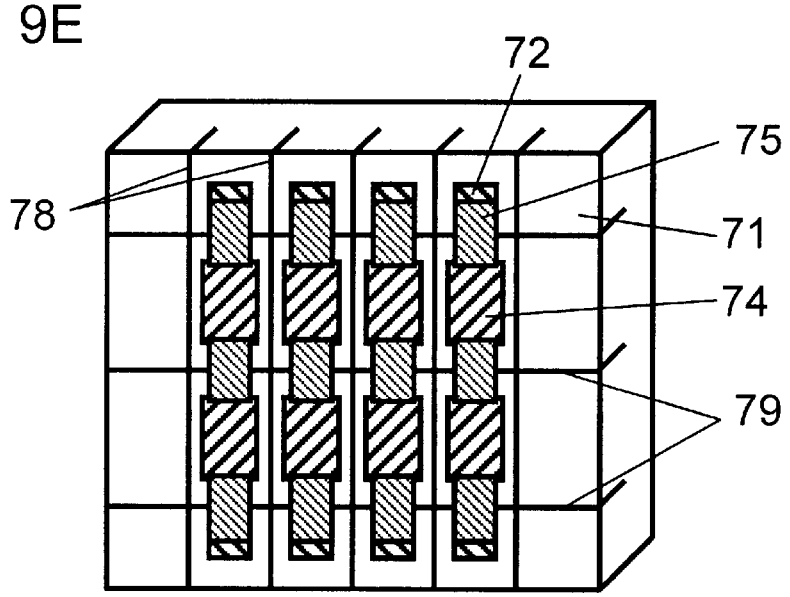

Next, as shown in FIG. 9E, an electrode paste, typically containing glass frit and a conductive powder such as Cu, is printed on the top face of each of the first top electrode layers of adjacent resistors in the vertical direction, crossing the horizontal division slit 79, and fired at approximately 600° C. in the nitrogen ambient to form the second top electrode layer 75. Here, the electrode paste fills the horizontal division slit 79 so that the second top electrode layer 75 is formed to the bottom of the division slit. The second top electrode layer 75 may be formed continuously on more than one first top electrode layer 72 horizontally aligned, crossing the vertical division slit 78.

Figure 9F:
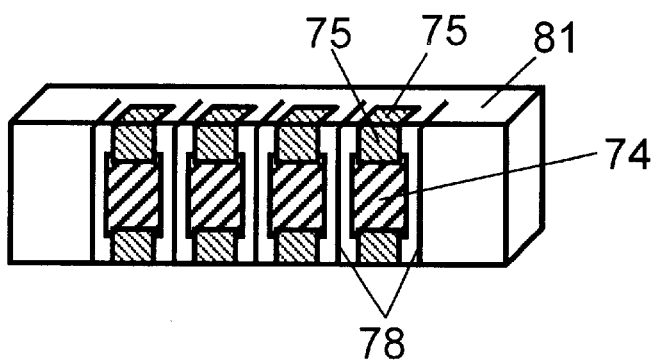
Figure 10:
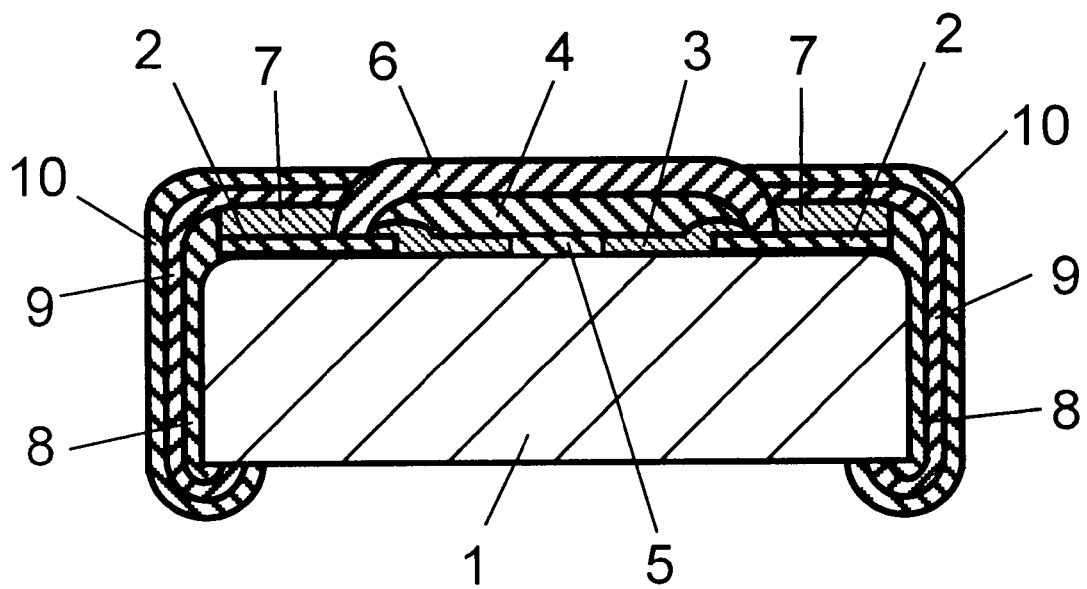
FIG. 10 is a section view of a resistor of the prior art.
Figure 11A:
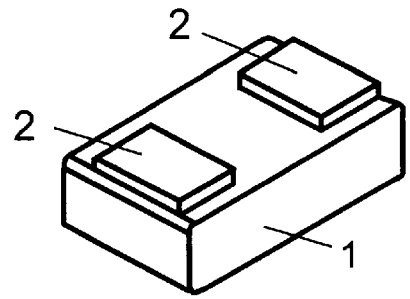
FIGS. 11A to 11F are process flow charts illustrating a method for manufacturing the resistor in accordance with the prior art.
Figure 11B:
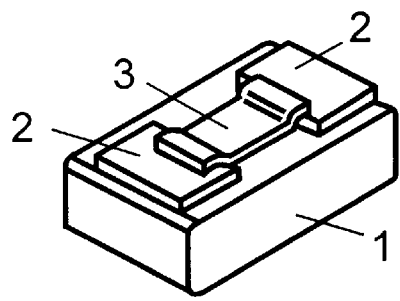
Figure 11C:
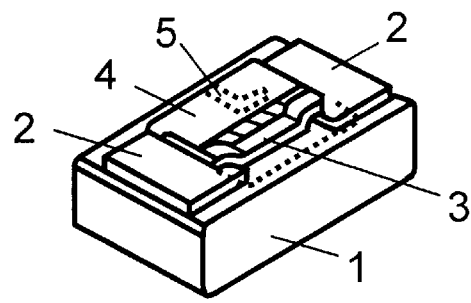
Figure 11D:
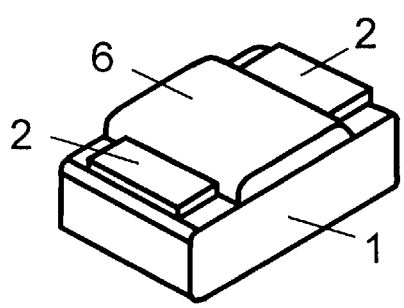
Figure 11E:
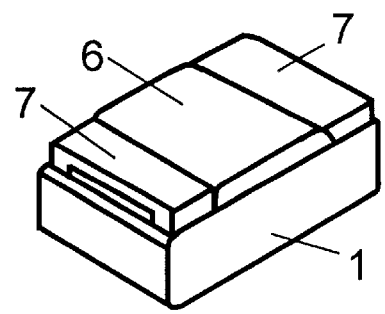
Figure 11F:
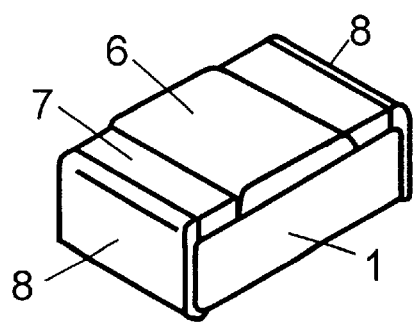
Figure 12A:
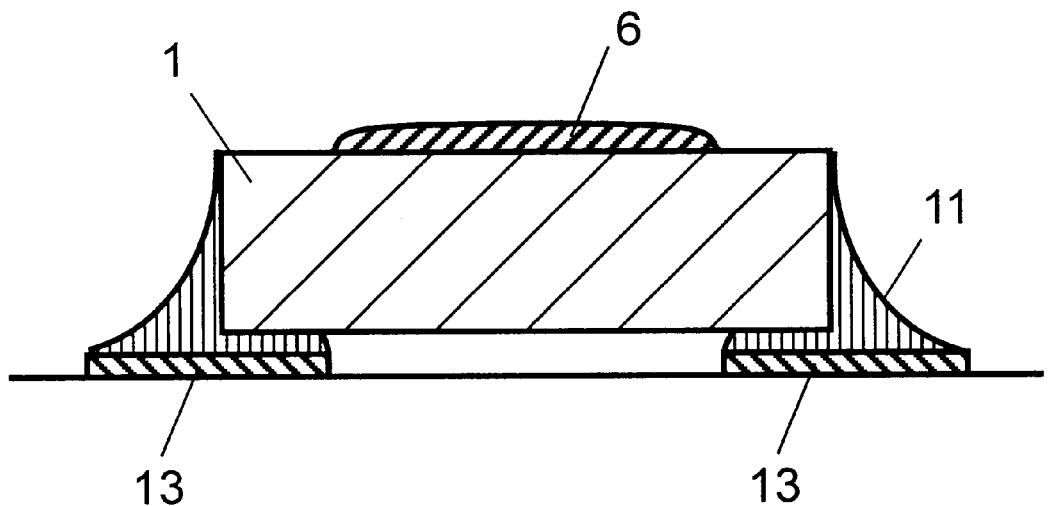
FIG. 12A is a section view of a mounted resistor of the prior art.
Figure 12B:
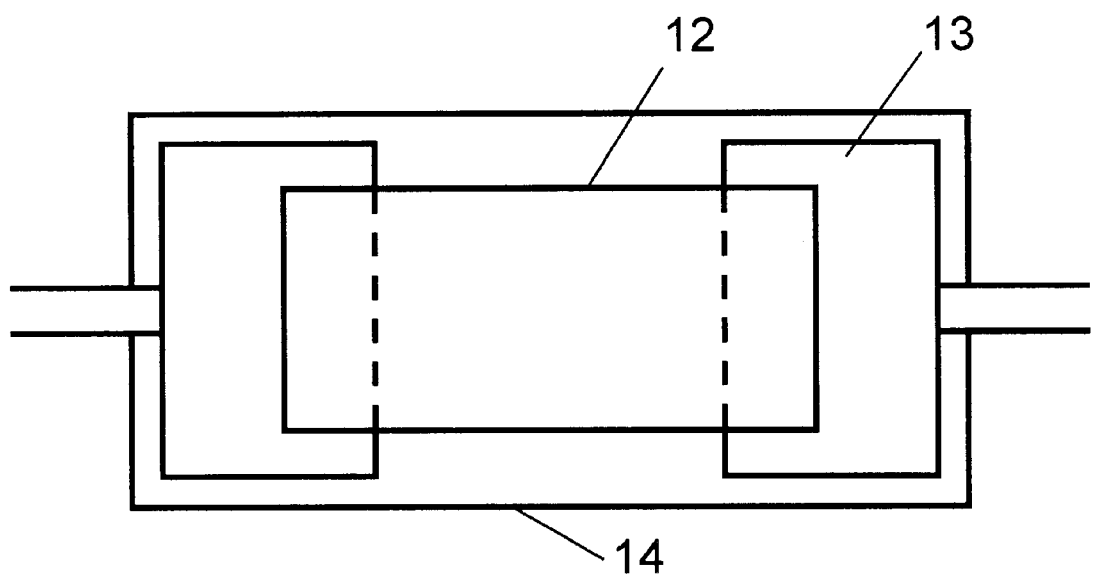
FIG. 12B is a top view of the mounted resistor of the prior art.

Next, as shown in FIG. 9F, the sheet substrate 71 is divided along the horizontal division slit 79 to create a substrate strip 81. Since the second top electrode layer 75 is formed to the bottom of the horizontal division slit 79, the second top electrode layer 75 extends to the divided face of the substrate strip 81.

Lastly, as shown in FIG. 9G, the substrate strip 81 is divided along the vertical division slit 78 to create a substrate piece 82. Solder is electroplated on an exposed surface of the second top electrode layer 75 to form the solder layer 76, as shown in FIG. 8, completing the manufacture of the resistor in the fourth exemplary embodiment.

The effects of the resistor in this exemplary embodiment when mounted on a printed wiring board is the same as the first exemplary embodiment. Accordingly, its explanation is omitted here.

In this exemplary embodiment, the solder layer is formed by electroplating. However, dip soldering in a melted solder bath between approximately 200° C. and approximately 250° C. is also applicable. Furthermore, transfer printing of a paste material mainly made of tin or solder onto the second top electrode layer 75 and application of heat treatment at an ambient temperature of approximately 200° C. to approximately 280° C. is also feasible.

Table 4 and 5 shows the effects (improved characteristics) achieved by changing the combination of materials for the first top electrode layer 72, protective layer 74, and second top electrode layer 75.

TABLE 4

| Combination | First top electrode layer 72 | Second top electrode layer 75 | Protective layer 74 | Improved characteristics |
|---|---|---|---|---|
| 14 | Au conductive powder + Glass (Baked at 850° C.) | Ag Pd conductive powder + Glass (Baked at 600° C.) | Glass system (Cured at 600° C.) | Baking of the second top electrode layer in air enables to manufacture the resistor less expensively. |
| 15 | Ag conductive powder + Glass (Baked at 850° C.) | Ni conductive powder + Glass (Baked at 600° C.) | Glass system (Cured at 600° C.) | In addition to the characteristics of the above combination 14, the use of Ni for the electrode enables to manufacture the resistor more inexpensively. |
| 16 | Ag conductive Powder + Glass (Baked at 850° C.) | Cu conductive powder + Resin (Cured at 200° C.) | Resin system (Cured at 200° C.) | Low treatment temperature for the protective layer 74 prevents changes in a resistance value in the process, reducing deviations in the resistance of products. |
| 17 | Ag conductive Powder + Glass (Baked at 850° C.) | Ni conductive powder + Resin (Cured at 200° C.) | Resin system (Cured at 200° C.) | In addition to the characteristics of the above Combination 16, the use of Ni for the second top electrode enables to manufacture the resistor more inexpensively. |
| 18 | Ag conductive Powder + Glass (Baked at 850° C.) | Cu + Ni mixed conductive powder + Resin (Cured at 200° C.) | Resin system (Cured at 200° C.) | In addition to the characteristics of the above Combination 16, the use of Cu + Ni for the second top electrode stabilizes solder wetting. |
| 19 | Ag conductive Powder + Glass (Baked at 850° C.) | Cu + Ni alloy conductive powder + Resin (Cured at 200° C.) | Resin system (Cured at 200° C.) | In addition to the characteristics of the above Combination 16, the use of Cu + Ni for the second top electrode stabilizes solder wetting. |
| 20 | Au conductive Powder + Glass (Baked at 850° C.) | Cu conductive powder + Glass (Baked at 600° C.) | Glass system (Cured at 600° C.) | Less ion migration improves the moisture Resistance life characteristic |
| 21 | Au conductive Powder + Glass (Baked at 850° C.) | Ag Pd conductive powder + Glass (Baked at 600° C.) | Glass system (Cured at 600° C.) | Combined characteristics of the above combinations 14 and 20. |

TABLE 5

| Combination | First top Electrode layer 72 | Second top electrode layer 75 | Protective layer 74 | Improved characteristics |
|---|---|---|---|---|
| 22 | Au conductive Powder + Glass (Baked at 850° C.) | Ni conductive powder + Glass (Baked at 600° C.) | Glass system (Cured at 600° C.) | Combined characteristics of the above combinations 15 and 20. |
| 23 | Au conductive Powder + Glass (Baked at 850° C.) | Cu conductive powder + Resin (Cured at 200° C.) | Resin system (Cured at 200° C.) | Combined characteristics of the above combinations 16 and 20. |
| 24 | Au conductive Powder + Glass (Baked at 850° C.) | Ni conductive powder + Resin (Cured at 200° C.) | Resin system (Cured at 200° C.) | Combined characteristics of the above combinations 17 and 20. |
| 25 | Au conductive Powder + Glass (Baked at 850° C.) | Cu + Ni mixed Conductive powder + Resin (Cured at 200° C.) | Resin system (Cured at 200° C.) | Combined characteristics of the above combinations 18 and 20. |
| 26 | Ag conductive Powder + Glass (Baked at 850° C.) | Cu + Ni alloy Conductive powder + Resin (Cured at 200° C.) | Resin system (Cured at 200° C.) | Combined characteristics of the above combinations 19 and 20. |

What is claimed is:

1. A resistor comprising:
a substrate having a top face and a plurality of side faces;
a pair of first top electrode layers disposed at least on said substrate top face;
a resistance layer disposed over said top face so as to electrically connect with said first top electrode layers;
a protective layer disposed so as to cover at least said resistance layer; and
a pair of second top electrode layers disposed over said pair of first top electrode layers at least above said substrate top face;
wherein at least one of said pairs of first top electrode layers and second top electrode layers extends to adhere partially onto said substrate side faces.

2. The resistor of claim 1 wherein each of said first top electrode layers has an exposed area that remains uncovered by said protective layer and said second top electrode layer; and said resistor further comprises a plating layer covering each said second top electrode layer.

3. The resistor of claim 1 wherein:
said pair of first top electrode layers is disposed only on said substrate top face;
each said second top electrode layer extends to a portion of the substrate side face adjacent thereto; and the resistor further comprises a plating layer disposed over said second top electrode layer such that said first top electrode layer and said plating layer are in direct electrical contact.

4. The resistor of claim 3 wherein a clearance is defined between said protective layer and each of said second top electrode layers, said clearance defining an exposed portion of each said first top electrode layer, wherein said exposed portion and said plating layer are in direct electrical contact.

5. The resistor of claim 3 wherein a window is formed through each of said second top electrode layers over said substrate top face, each said window defining an exposed portion of each said first top electrode layer, and being surrounded by said corresponding second top electrode layer wherein said exposed portion and said plating layer are in direct electrical contact through said corresponding second top electrode layer.

6. The resistor of claim 3 wherein said substrate side face has an area and the portion of each said substrate side face over which each said second top electrode layer extends has an area not larger than half of the substrate side face area.

7. The resistor of claim 3 wherein said protective layer has a surface, and
said plating layer has a surface that is level with or higher than the protective layer surface.

8. The resistor of claim 3 wherein said first top electrode layer comprises at least one of: a fired mixture of silver conductive powder and glass, a fired mixture of gold conductive powder and glass, or
a fired gold organic compound; and
said second top electrode layer comprises a mixture of silver conductive powder and resin or a mixture of nickel conductive powder and resin.

9. The resistor of claim 3 wherein said first top electrode layer comprises at least one of sputtered nickel or sputtered gold; said second top electrode layer comprises a mixture of silver conductive powder and resin or a mixture of nickel conductive powder and resin; and said protective layer comprises resin.

10. The resistor of claim 1 wherein:
the substrate top face has opposite ends and a side face adjacent each end; and
said pair of first top electrode layers is disposed on said opposite ends of said substrate top face, each first top electrode layer extending to a portion of the side face adjacent thereto; and
said resistor further comprises a solder layer disposed over said pair of second top electrode layers.

11. The resistor of claim 10 wherein each substrate side face adjacent the end has an area and the portion of said substrate side face over which said first top electrode layer extends has an area that is not larger than half of said substrate side face area.

12. The resistor of claim 10 wherein said protective layer has a surface, and said solder layer has a surface that is level with or higher than the protective layer surface.

13. The resistor of claim 10 wherein said first top electrode layer comprises at least one of a fired mixture of silver conductive powder and glass,
a fired mixture of gold conductive powder and glass; or
a fired gold organic compound.

14. The resistor of claim 13 wherein said second top electrode layer comprises at least one of a mixture of copper conductive powder and glass, a mixture of silver palladium conductive powder and glass, or a mixture of nickel conductive powder and glass; and said protective layer comprises glass.

15. The resistor of claim 13 wherein said second top electrode layer comprises at least one of a mixture of copper conductive powder and resin or a mixture of nickel conductive powder and resin; and said protective layer comprises resin.

16. The resistor of claim 13 wherein said second top electrode layer comprises a mixture of copper conductive powder, nickel conductive powder, and resin; and said protective layer comprises resin.

17. The resistor of claim 13 wherein said second top electrode layer comprises a mixture of copper and nickel alloy powder and resin, and said protective layer comprises resin.

18. The resistor of claim 1 comprising:

a substrate having a top face with opposite ends and a side face adjacent each end;

a pair of first top electrode layers disposed on said opposite ends of said substrate top face;

a resistance layer disposed so as to electrically cormect with said first top electrode layers;

a pair of second top electrode layers disposed over said pair of first top electrode layers, each second top electrode layer extending to a portion of the side face adjacent thereto;

a protective layer disposed so as to cover at least said resistance layer; and a solder layer disposed over said second top electrode layer.

19. The resistor of claim 18 wherein the substrate side face has an area and the portion of said substrate side face over which said second top electrode layer extends has an area that is not larger than half of the substrate side face area.

20. The resistor of claim 18 wherein said protective layer has a surface, and said solder layer has a surface that is level with or higher than the protective layer surface.

21. The resistor of claim 18 wherein said first top electrode layer comprises at least one of a fired mixture of silver conductive powder and glass, a fired mixture of gold conductive powder and glass, or a fired gold organic compound.

22. The resistor of claim 21 wherein said second top electrode layer comprises at least one of:

a mixture of copper conductive powder and glass, a mixture of silver-palladium conductive powder and glass, or a mixture of nickel conductive powder and glass; and said protective layer comprises glass.

23. The resistor of claim 21 wherein said second top electrode layer comprises at least one of a mixture of copper conductive powder and resin or a mixture of nickel conductive powder and resin; and said protective layer comprises resin.

24. The resistor of claim 21 wherein said second top electrode layer comprises a mixture of copper conductive powder, nickel conductive powder, and resin; and said protective layer comprises resin.

25. The resistor of claim 21 wherein said second top electrode layer comprises a mixture of copper-nickel alloy powder and resin; and said protective layer comprises resin.

* * * * *

UNITED STATES PATENT AND TRADE MARK OFFICE
CERTIFICATE OF CORRECTION

PATENT NO. : 6,023,217
DATED : February 8, 2000
INVENTOR(S) : Yamada et al.

It is certified that error appears in the above-identified patent and that said Letters Patent is hereby corrected as shown below:

Column 15, line 19, "cormect" should read --connect--.

Signed and Sealed this

Twenty-seventh Day of March, 2001

NICHOLAS P. GODICI

*Attest:*

*Attesting Officer*          Acting Director of the United States Patent and Trademark Office